US009963341B2

(12) United States Patent
Potasek et al.

(10) Patent No.: US 9,963,341 B2
(45) Date of Patent: May 8, 2018

(54) PRESSURE SENSOR PACKAGE WITH STRESS ISOLATION FEATURES

(71) Applicant: Rosemount Aerospace Inc., Burnsville, MN (US)

(72) Inventors: David P. Potasek, Lakeville, MN (US); Robert Stuelke, Minneapolis, MN (US)

(73) Assignee: Rosemount Aerospace, Inc., Burnsville, MN (US)

( * ) Notice: Subject to any disclaimer, the term of this patent is extended or adjusted under 35 U.S.C. 154(b) by 0 days. days.

(21) Appl. No.: 14/716,515

(22) Filed: May 19, 2015

(65) Prior Publication Data
US 2016/0340176 A1 Nov. 24, 2016

(51) Int. Cl.
B81B 7/00 (2006.01)
(52) U.S. Cl.
CPC .......... *B81B 7/0058* (2013.01); *B81B 7/0048* (2013.01); *B81B 2207/015* (2013.01); *H01L 2224/48247* (2013.01)
(58) Field of Classification Search
USPC .......... 257/419; 73/700, 715, 753, 754, 756; 156/308.2, 60
IPC ................ B81B 7/0048; G01L 19/146,19/147, 19/148, 19/04, 19/145; H01L 2224/48091, 2224/49171, 2224/73265, 2924/00014; Y10T 156/10
See application file for complete search history.

(56) References Cited

U.S. PATENT DOCUMENTS

| 4,563,697 | A | * | 1/1986 | Miura | ................... G01L 19/003 174/50.54 |
| 7,377,177 | B1 | | 5/2008 | Lamb et al. | |
| 7,647,835 | B2 | | 1/2010 | Speldrich | |
| 8,322,225 | B2 | | 12/2012 | Bentley et al. | |
| 8,820,170 | B2 | | 9/2014 | Slakhorst et al. | |
| 2014/0076057 | A1 | * | 3/2014 | Slakhorst | .............. G01L 19/145 73/715 |
| 2014/0076059 | A1 | * | 3/2014 | Hop | ........................ G01L 19/04 73/756 |

FOREIGN PATENT DOCUMENTS

EP 1837303 A1 9/2007
EP 2653443 A2 10/2013

OTHER PUBLICATIONS

Extended European Search Report for Application No. 16170089.3, dated Sep. 22, 2016, 5 Pages.

* cited by examiner

Primary Examiner — Hrayr A Sayadian
(74) Attorney, Agent, or Firm — Kinney & Lange, P.A.

(57) ABSTRACT

A sensor package includes a manifold and a MEMS die. The manifold includes a cylindrical body, a flange, and a mounting surface. The cylindrical body defines a first passage that extends longitudinally along a central axis from a first exterior end to an interior end of the cylindrical body. The flange extends from the cylindrical body and has an outer periphery that is configured to support a print circuit board. The mounting surface is disposed at the interior end of the first passage. The surface area of the mounting surface is less than the surface area of a MEMS die configured to mate with the mounting surface.

20 Claims, 6 Drawing Sheets

PRESSURE SENSOR PACKAGE WITH STRESS ISOLATION FEATURES

BACKGROUND

The present invention relates generally to sensor packages, and more particularly, to features of sensor packages for stress isolation.

Sensor packages utilize microelectromechanical systems ("MEMS") (e.g., dies) to perform sensor functions. Multiple dies are simultaneously constructed on a silicon wafer. Individual dies are cut from the wafer and mounted to a circuit board to integrate sensors into the circuit. To protect the die and circuit board from damage and to provide an interface to the sensor, the die and circuit board are mounted within a sensor package.

Sensor packages have various configurations for supporting the die and circuit board. In some sensor packages, the die is bonded directly to the circuit board. Direct bonding of the die to the circuit board is economical, but leaves the die vulnerable to thermally-induced stress (e.g. thermal expansion of dissimilar materials and the like) and to mechanical-induced stress (e.g. external loads imposed on the sensor package and the like). In other sensor packages, dies are bonded to pedestals to isolate the die from thermally-induced and mechanically-induced stress. Within such packages, the die is bonded to pedestal that is larger than the die itself, and sometimes, the pedestal is constructed from a material with a similar coefficient of expansion to further isolate the die. Sensor packages used for precision sensors are typically hermetically sealed. In addition, the stress isolation features of the previously described sensor packages, the dies of hermetically sealed sensors are encapsulated within the package. Because of this additional measure of isolation, feedthrough features are added to transmit signals from the die through the hermetic barrier.

However, each configuration creates complexity and additional manufacturing. Therefore, many sensor packages use cheaper, less complex forms of stress isolation. The present invention, which is described in detail hereafter, reduces complexity and manufacturing cost while providing the stress isolation benefits of more complex and costly sensor packages.

SUMMARY

A sensor package includes a manifold and a MEMS die. The manifold includes a cylindrical body, a flange, and a mounting surface. The cylindrical body defines a first passage that extends longitudinally along a central axis from a first exterior end to an interior end of the cylindrical body. The flange extends from an outer periphery of the cylindrical body. The mounting surface is disposed at the interior end of the first passage. A surface area of the mounting surface is less than a surface area of the MEMS die.

A manifold for a MEMS sensor package includes a cylindrical body, a flange, and a mounting surface. The cylindrical body defines a first passage that extends longitudinally along a central axis from a first exterior end to an interior end of the cylindrical body. The flange extends from the cylindrical body and has an outer periphery that is configured to support a print circuit board. The mounting surface is disposed at the interior end of the first passage. The surface area of the mounting surface is less than the surface area of a MEMS die configured to mate with the mounting surface.

DETAILED DESCRIPTION

Figure 1:
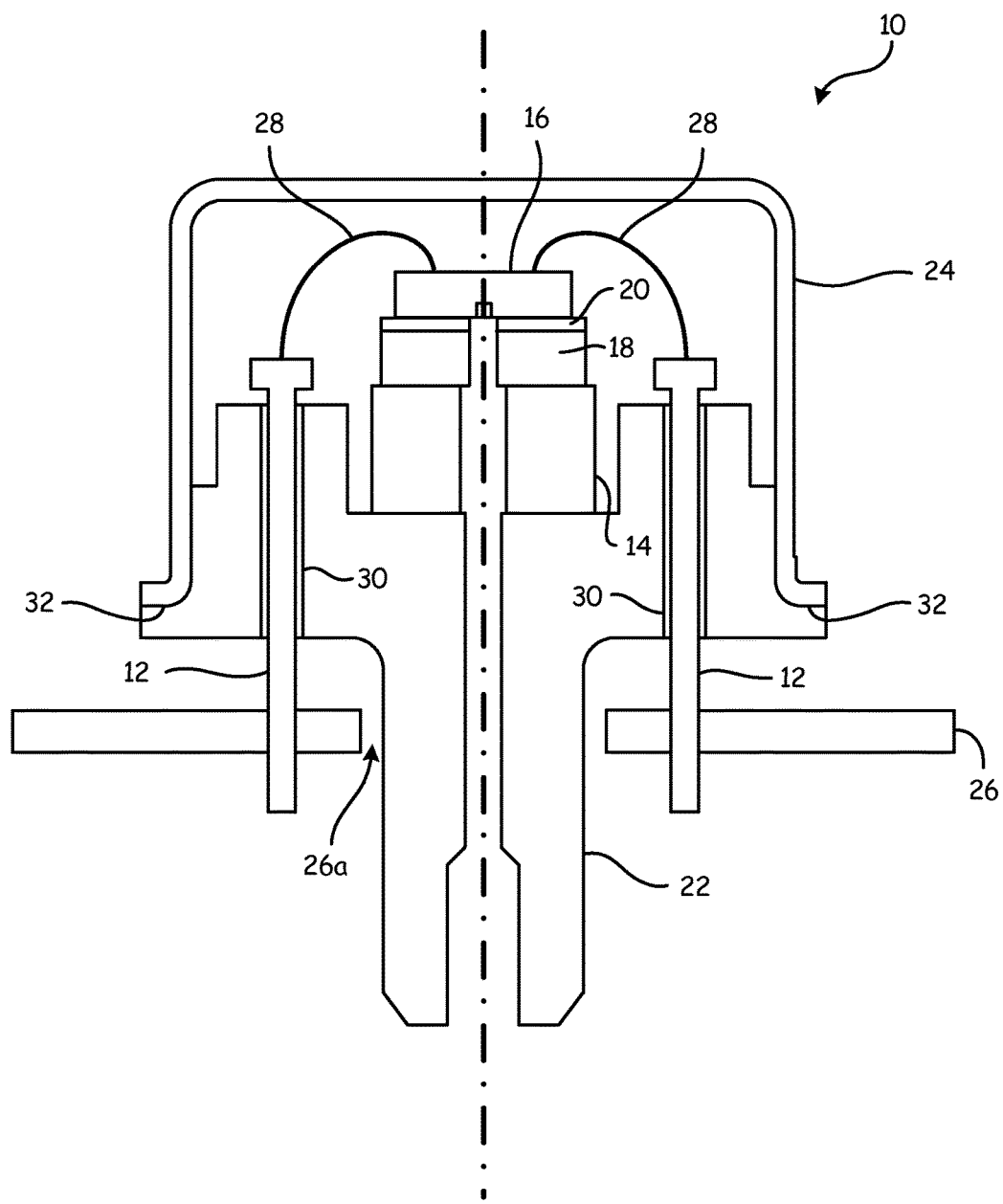
FIG. 1 is a cross-sectional view of a sensor package having prior art stress isolation features.

FIG. 1 is a cross-sectional view of sensor package 10 that includes, among other components and features described hereafter, feed-through connections 12 and prior art stress isolation features, which include pedestal 14. Such stress isolation features increase reliability and accuracy of die 16, which contains internal features for performing one or more measurements (i.e., pressure measurements). Because of the manufacturing complexity and cost, these stress isolation features cannot be economically incorporated into some sensor packages. As will become apparent, stress isolation features of the present invention provide similar benefits in a less complex and more economical package.

Pedestal 14 supports die 16 within sensor package 10. Optionally, intermediate supports 18 and 20 can be disposed between pedestal 14 and die 16. The materials of pedestal 14 and intermediate layers 18 and 20 are selected to minimize differential growth among die 16, pedestal 14, and intermediate layers 18 and 20.

Manifold 22 and cap 24 enclose die 16. Manifold 22 extends through circuit board 26 having aperture 26a to provide clearance therebetween. Die 16 electrically communicates with circuit board 26 through wires 28 and feed-through connections 12, which are electrically isolated and sealed with respect to manifold 22 by seal 30. Cap 24 joins to manifold 22 at flange 32.

The manufacture of sensor package 10 involves several costly components and assembly processes. For instance, pedestal 14 and intermediate supports 18 and 20 are designed, manufactured and assembled with respect to die 16 to provide stress isolation of die relative to manifold 22 and circuit board 26. Additionally, die 16 must be aligned with respect to feed-through connections 12, which in turn, are aligned with respect to manifold 22. Although beneficial to sensor performance, these components and assembly steps require tighter manufacturing tolerances and thereby increase the complexity and manufacturing cost of sensor package 10 relative to sensor packages without these features.

Figure 2A:
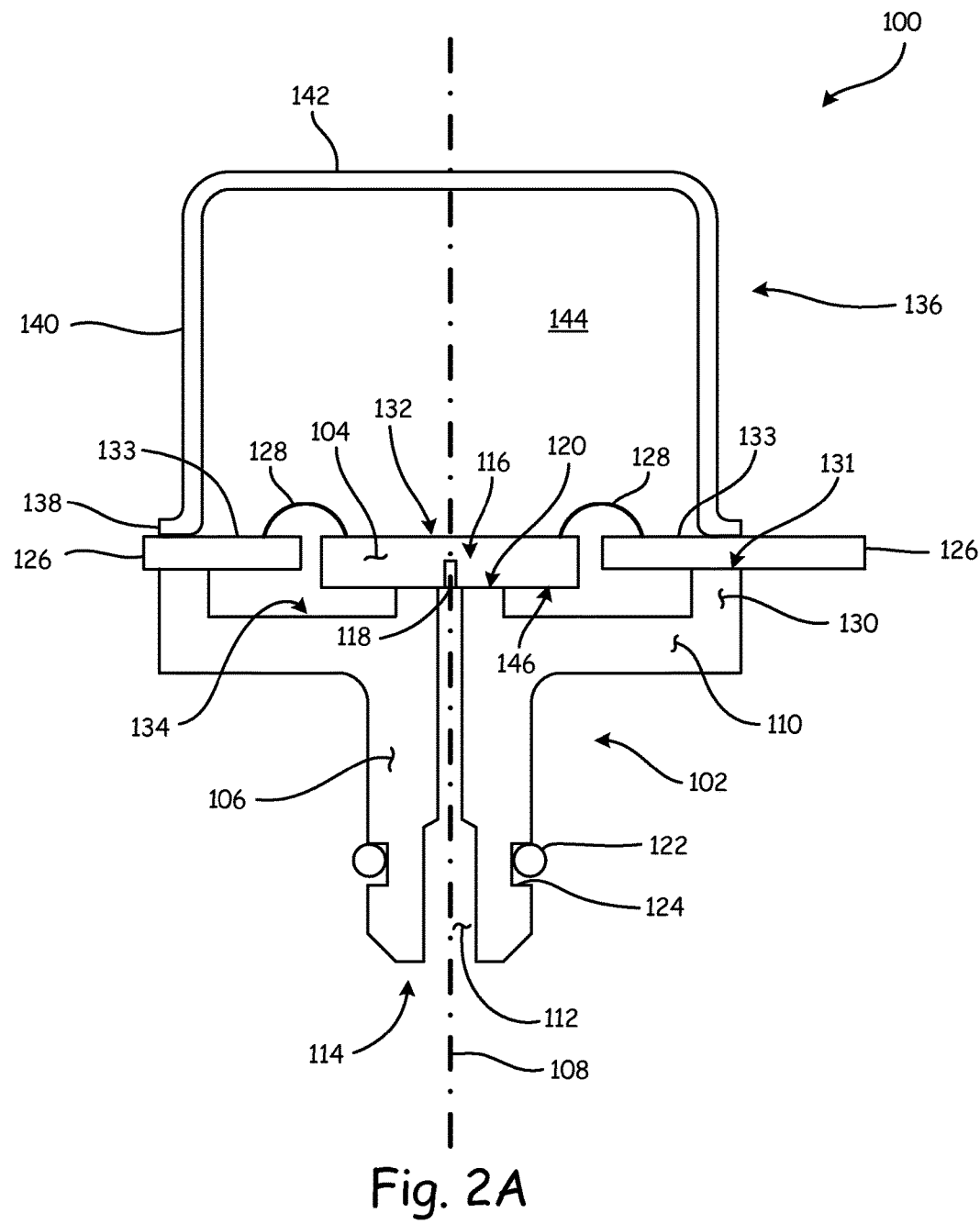
FIG. 2A is a cross-sectional view of a sensor package having a die bonded to a mounting surface.

FIG. 2A is a cross-sectional view of sensor package 100 that includes manifold 102 for supporting die 104. Manifold 102 includes cylindrical body 106 extending longitudinally along central axis 108 and flange 110 extending from an exterior surface of body 106. Cylindrical body 106 defines passage 112 extending along central axis 108 from exterior end 114 to interior end 116. Passage 112 fluidly communicates with pressure port 118, which provides fluid communication to internal features (not shown in FIG. 2A) of die 104 to facilitate pressure measurements. For sealing and engaging an external pressure source (not shown in FIG. 2A), cylindrical body 106 has seal 122 received in groove 124. Seal 122 and groove 124 are disposed adjacent to exterior end 114 of cylindrical body 106.

At the interior end of manifold 102, die 104 is bonded to mounting surface 120 and wire bonded to circuit board 126 using wires 128. Wires 128 form a loop or arch to permit movement of die 104 relative to circuit board 126. Raised portion 130 of flange 110 has flange surface 131 that supports circuit board 126. Flange surface 131 extends along an outer periphery of raised portion 130. Die 104 has surface 132 from which wires 128 extend. Mounting surface 120 can be offset relative to flange surface 131 towards exterior end 114 such that surface 132 aligns with surface 133 of circuit board 126. Extending between raised portion 130 and mounting surface 120 is recess 134, which provides clearance between die 104 and manifold 102. Additionally, die 104 is sized to provide clearance between die 104 and circuit board 126. Thus, die 104 mechanically interfaces sensor package 100 solely at mounting surface 120.

Optionally, sensor package 100 can include cap 136. If cap 136 is not included, a conformable, dielectric coating (not shown in FIG. 2A) can be used to limit moisture and dust penetration into die 104 and circuit board 126 while electrically insulating sensor package 100. Cap 136 has lip 138, body portion 140, and end wall 142. Lip 138 has an outer periphery that conforms to a shape of flange surface 131 and mates with circuit board 126. Body portion 140 extends from lip 138 in a direction away from die 104. End wall 142 encloses body portion 140 at an end opposite lip 138. Together, lip 138, body portion 140, and end wall 142 form cap 136, which protects die 104 from external contamination. Manifold 102, die 104, circuit board 126, and cap 136 define an interior volume 144. Generally, cap 136 is axisymmetric about central axis 108.

In some embodiments, metallic bonds affix mating surfaces among die 104, mounting surface 120, circuit board 126, and cap 136, each bond contributing to a hermetically sealed package. To form a hermetic seal along a bonded surface, the mating compounds are joined using a metallic material that is non-permeable and prevents diffusion of gases across the bond. In some embodiments, the through thickness distance of the bond can be increased to improve sealing performance. In such embodiments, interior volume 144 can have a vacuum pressure (i.e., negative gage pressure) to serve as a reference for pressure measurements performed within die 104. Thus, the hermetically sealed cap provides a contained reference pressure, thereby providing increased accuracy and precision for pressure measurements conducted within die 104.

Mounting surface 120 acting in conjunction with recess 134 provide stress isolation to die 104. Mounting surface 120 has a surface area less than a surface area of mating die surface 146. Thus, mounting surface 120 is smaller than die 104. A radial thickness of mounting surface 120 extends from passage 112 to internal volume 144 in a direction substantially perpendicular to central axis 108. The radial thickness of mounting surface 120 is at least sufficient to provide a seal between passage 112 and interior volume 144. The maximum radial thickness of mounting surface 120 is the thickness that results in mounting surface 120 equating surface 146. However, as the radial thickness of mounting surface 120 increases from the minimum thickness necessary to provide a seal to the maximum thickness, the degree of stress isolation decreases. Because recess 134 facilitates clearance between die 104 and components of sensor package 100 that surround die 104, die 104 is permitted to expand, contract, and deflect due to communication with passage 112 without mechanical or thermal interference from other sensor package 100 components. Thus, mounting surface 120 eliminates pedestal 14 and intermediate layers 18 and 20 that perform stress isolation functions in sensor package 10 (see FIG. 1).

Figure 2B:
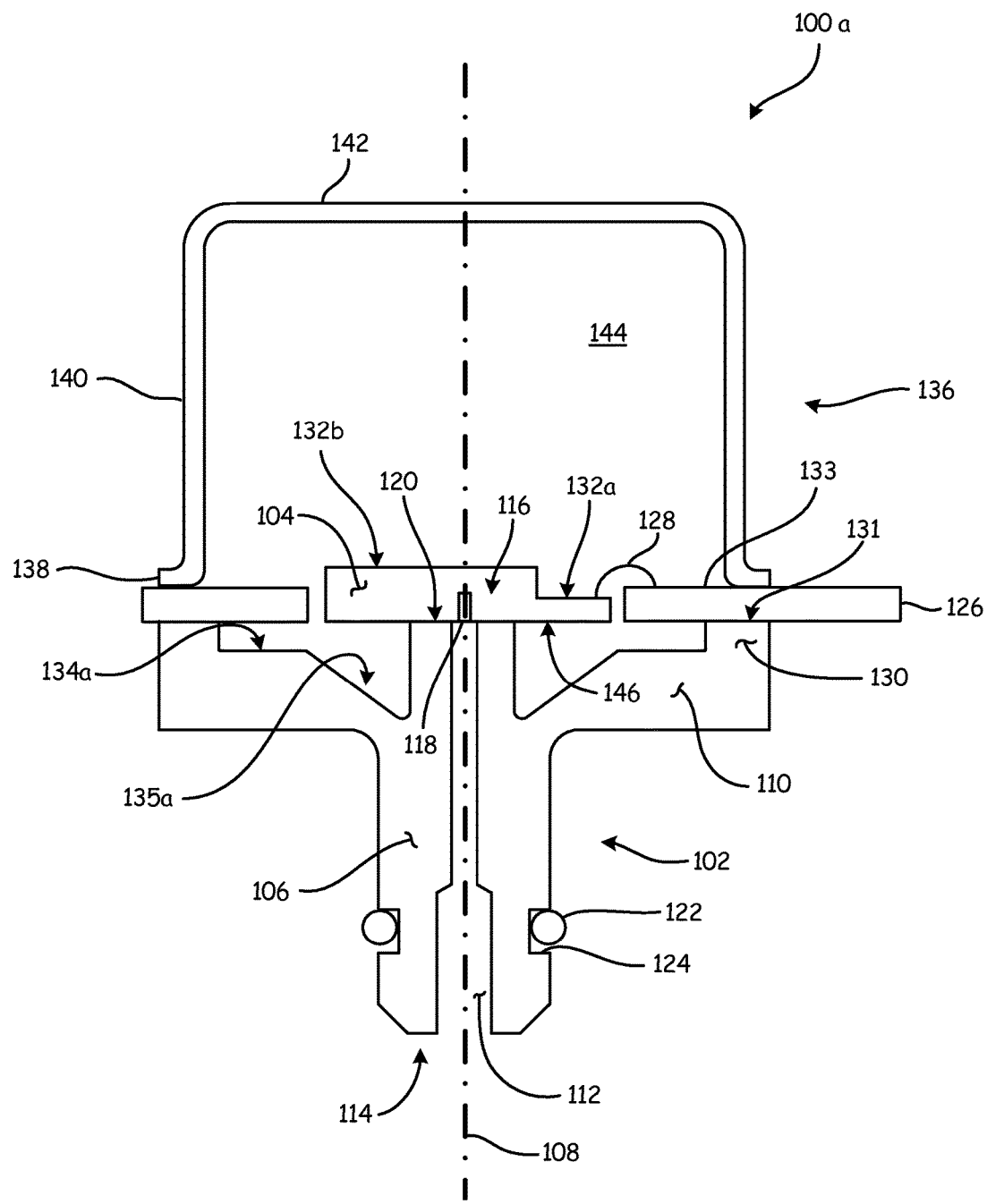
FIG. 2B is a cross-sectional view of a sensor package in which a portion of the recess adjacent to the mounting surface has a substantially triangular cross-section.

FIG. 2B is a cross-sectional view of sensor package 100a that is substantially similar to sensor package 100 in which the reference numbers refer to like components. However, sensor package 100a includes recess 134a instead of recess 134. Recess 134a includes recess portion 135a adjacent to mounting surface 120. Recess 135a has a substantially triangular cross-section relative to central axis 108. Typically, recess 134a and recess portion 135a are axisymmetric with respect to axis 108. Recess portion 135a provides additional stress isolation by further decoupling mounting surface 120 from flange 110. For example, a height of portion 135a parallel to axis 108 can be approximately equal to a diameter of mounting surface 120. Additionally, die 104 has surfaces 132a and 132b, surface 132a being offset from surface 132b towards the exterior end of manifold 102 such that surface 132a aligns with circuit board 126. Thus, wires 128 extend from surface 132a to circuit board 126. In all other respects, components of sensor package 100a function in a substantially similar manner to sensor package 100. Offsetting surfaces 132a and 132b of die 104 allows mounting surface 120 to be further isolated from flange 110 while maintaining alignment of surface 132a with surface 133 of circuit board 126. Aligning surfaces 132a and 133 facilitates bonding wires 128 from die 104 to circuit board 126.

Figure 3A:
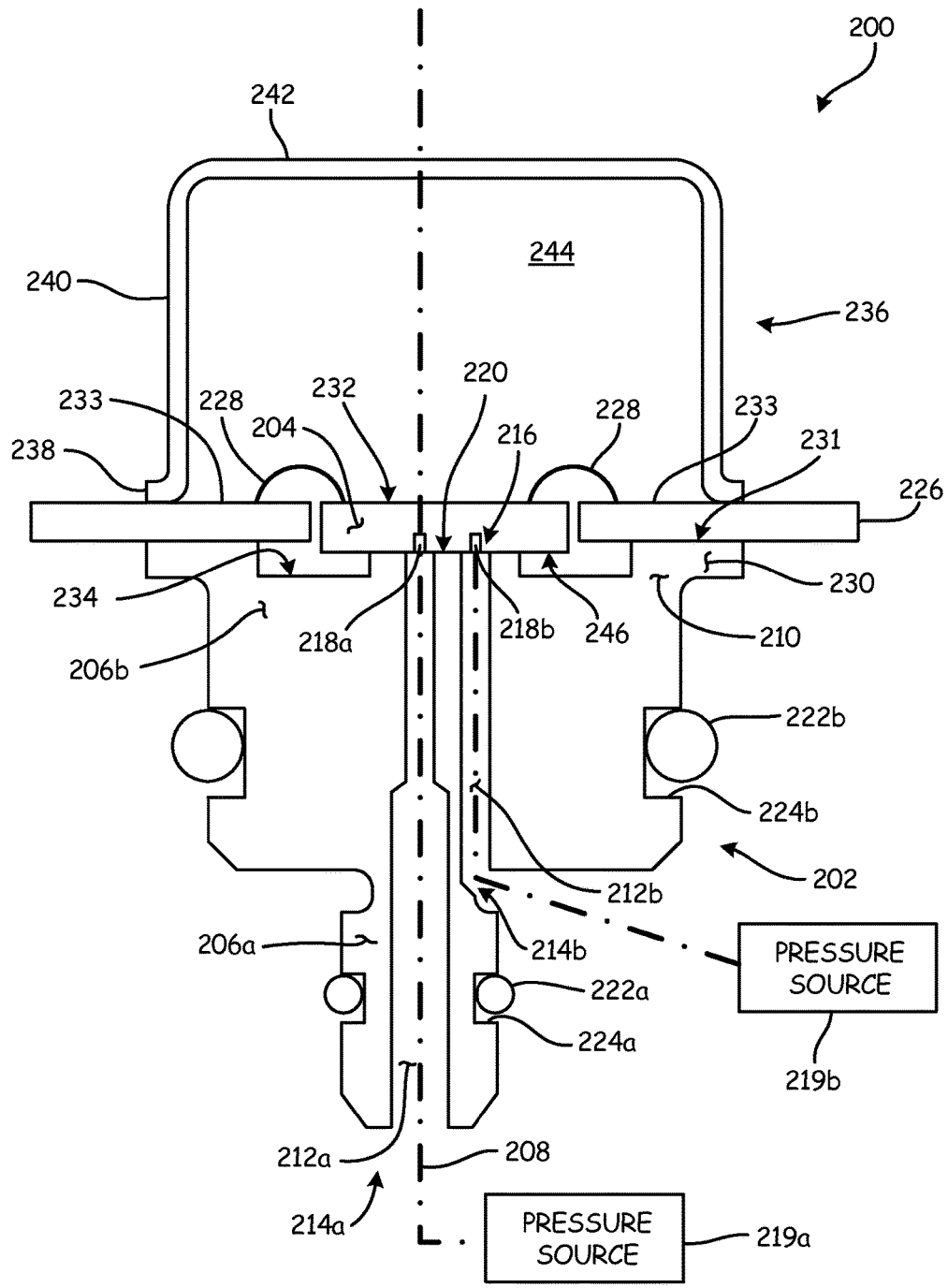
FIG. 3A is a cross-sectional view of a sensor package having a die bonded to a mounting surface in which the sensor package is configured to measure differential pressure.

FIG. 3A is a cross-sectional view of sensor package 200 that includes manifold 202 for supporting die 204, die 204 and manifold 202 being configured to measure differential pressure. Manifold 202 includes cylindrical bodies 206a and 206b extending longitudinally along central axis 208 and flange 210 extending from an exterior surface of body 206b. Cylindrical bodies 206a and 206b define passages 212a and 212b extending substantially parallel to central axis 208. Passage 212a extends from exterior end 214a to interior end 216, and passage 212b extends from exterior end 214b to interior end 216. Passage 212a fluidly communicates between pressure port 218a of die 204 and external pressure source 219a (shown schematically in FIG. 3A). Similarly, passage 212b fluidly communicates between pressure port 218b of die 204 and external pressure source 219b (shown schematically in FIG. 3A). Ports 218a and 218b provide fluid communication to internal features (not shown in FIG. 3A) of die 204 to facilitate measurement of differential pressure.

For sealing and engaging external pressure source 219a, cylindrical body 206a has seal 222a received in groove 224a. Seal 222a and groove 224a are disposed along a minor diameter of body 206a adjacent to exterior end 214. Similarly, for sealing and engaging external pressure source 219b, cylindrical body 206b has seal 222b received in groove 224b. Seal 222b and groove 224b are disposed along a major diameter of body 206b adjacent external end 214b. Seals 222a and 222b along with the stepped arrangement of bodies 206a and 206b fluidly isolate pressure sources 219a and 219b, allowing source 219a to have a pressure different than a pressure of source 219b.

At interior end 216 of manifold 202, die 204 is bonded to mounting surface 220 and wire bonded to circuit board 226 using wires 228. Wires 228 form a loop or arch to permit movement of die 204 relative to circuit board 226. Raised portion 230 of flange 210 has flange surface 231 that supports circuit board 226. Flange surface 231 extends along an outer periphery of raised portion 230. Die 204 has surface 232 from which wires 228 extend. Mounting surface 220 can be offset relative to flange surface 231 towards exterior end 214 such that surface 232 aligns with surface 233 of circuit board 226. Extending between raised portion 230 and mounting surface 220 is recess 234, which provides clearance between die 204 and manifold 202. In some embodiments, recess 234 can have a triangular shape in accordance with recess 134a and portion 135a described with reference to FIG. 2B. Additionally, die 204 is sized to provide clearance between die 204 and circuit board 226. Thus, die 204 mechanically interfaces sensor package 200 solely at mounting surface 220.

Optionally, sensor package 200 can include cap 236. If cap 236 is not included, a conformable, dielectric coating (not shown in FIG. 3A) can be used to limit moisture and dust penetration into die 204 and circuit board 226 while electrically insulating sensor package 200. Cap 236 has lip 238, body portion 240, and end wall 242. Lip 238 has an outer periphery that conforms to a shape of flange surface 231 and mates with circuit board 226. Body portion 240 extends from lip 238 in a direction away from die 204. End wall 242 encloses body portion 240 at an end opposite lip 238. Together, lip 238, body portion 240, and end wall 242 form cap 236, which protects die 204 from external contamination. Manifold 202, die 204, circuit board 226, and cap 236 define an interior volume 244. Generally, cap 236 is axisymmetric about central axis 208.

Similar to sensor package 100, some embodiments of sensor package 200 include metallic bonds that affix mating surfaces among die 204, mounting surface 220, circuit board 226, and cap 236, each bond contributing to a hermetically sealed package. To form a hermetic seal along a bonded surface, the mating compounds are joined using a metallic material that is non-permeable and prevents diffusion of gases across the bond. In some embodiments, the through thickness distance of the bond can be increased to improve sealing performance. In such embodiments, interior volume 244 can have a vacuum pressure (i.e., negative gage pressure) to serve as a reference for pressure measurements performed within die 204. Thus, the hermetically sealed cap provides a contained reference pressure, thereby providing increased accuracy and precision for pressure measurements conducted within die 204.

Mounting surface 220 acting in conjunction with recess 234 provide stress isolation to die 204. Mounting surface 220 has a surface area less than a surface area of mating die surface 246. Thus, mounting surface 220 is smaller than die 204. A radial thickness of mounting surface 220 extends from passage 212 to internal volume 244 in a direction substantially perpendicular to central axis 208. The radial thickness of mounting surface 220 is at least sufficient to provide a seal between passage 212 and interior volume 244. The maximum radial thickness of mounting surface 220 is the thickness that results in mounting surface 220 equating surface 246. However, as the radial thickness of mounting surface 220 increases from the minimum thickness necessary to provide a seal to the maximum thickness, the degree of stress isolation decreases. Because recess 234 facilitates clearance between die 204 and components of sensor package 200 that surround die 204, die 204 is permitted to expand, contract, and deflect due to communication passage 212 without mechanical or thermal interference from sensor package 100 components. Thus, mounting surface 220 eliminates pedestal 14 and intermediate layers 18 and 20 that perform stress isolation functions in sensor package 10 (see FIG. 1).

Figure 3B:
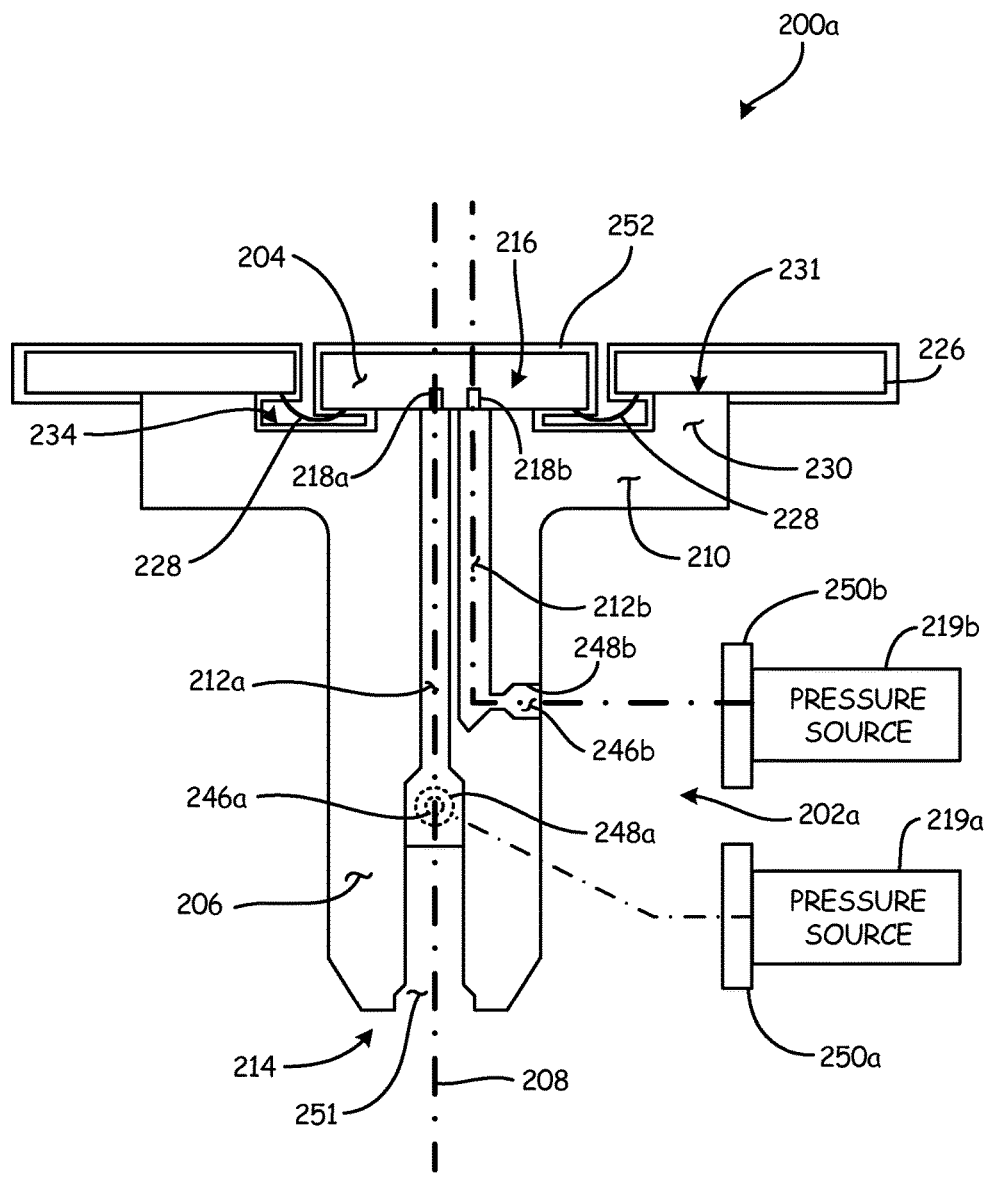
FIG. 3B is a cross-sectional view of a sensor package having an isolated die bonded to a mounting surface in which the sensor is configured to measure differential pressure.

FIG. 3B is a cross-sectional view of sensor package 200a that is substantially similar to sensor package 200 in which the reference numbers refer to like components. However, passages 212a and 212b of sensor package 200a engage external pressure sources 219a and 219b at ports 246a and 246b, respectively. Ports 246a and 246b extend in a transverse direction with respect to central axis 208 from an external surface of cylindrical body 206 to intersect passage 212a and 212b, respectively. Each port 246a and 246b has counter bore 248a (hidden in FIG. 3B) and 248b for receiving tubing (not shown), which is affixed to counter bores 248a and 248b to form a seal therebetween. The tubing (not shown in FIG. 3B) extend from ports 246a and 246b to diaphragms 250a and 250b, respectively, which fluidly isolate pressure sources 219a and 219b from die 204. Pressure acting on diaphragms 250a and 250b communicates to die 204 through an isolation fluid (not shown in FIG. 3B) contained within tubing (not shown in FIG. 3B) ports 246a and 246b, passages 212a and 212b, and ports 218a and 218b of die 204. Plug 251 is inserted into passage 212a at exterior end 214 to provide a seal.

Additionally, sensor package 200a includes environmental barrier 252. Barrier 252 coats exposed surfaces of die 204, circuit board 226, wires 228, and recess 234 to provide environmental protection similar to cap 236 (see FIG. 3B). Barrier 252 is a conformable, dielectric coating that limits moisture and dust penetration into die 204 and circuit board 226 while electrically insulating sensor package 200a. Typically, barrier 252 is applied using a vapor deposition process. Although, barrier 252 is shown in sensor package 200a, cap 236 can be used in lieu of barrier 252. Additionally, barrier 252 can be used in sensor packages 100, 100a, 200, and 200a described herein instead of a cap structure.

Figure 4:
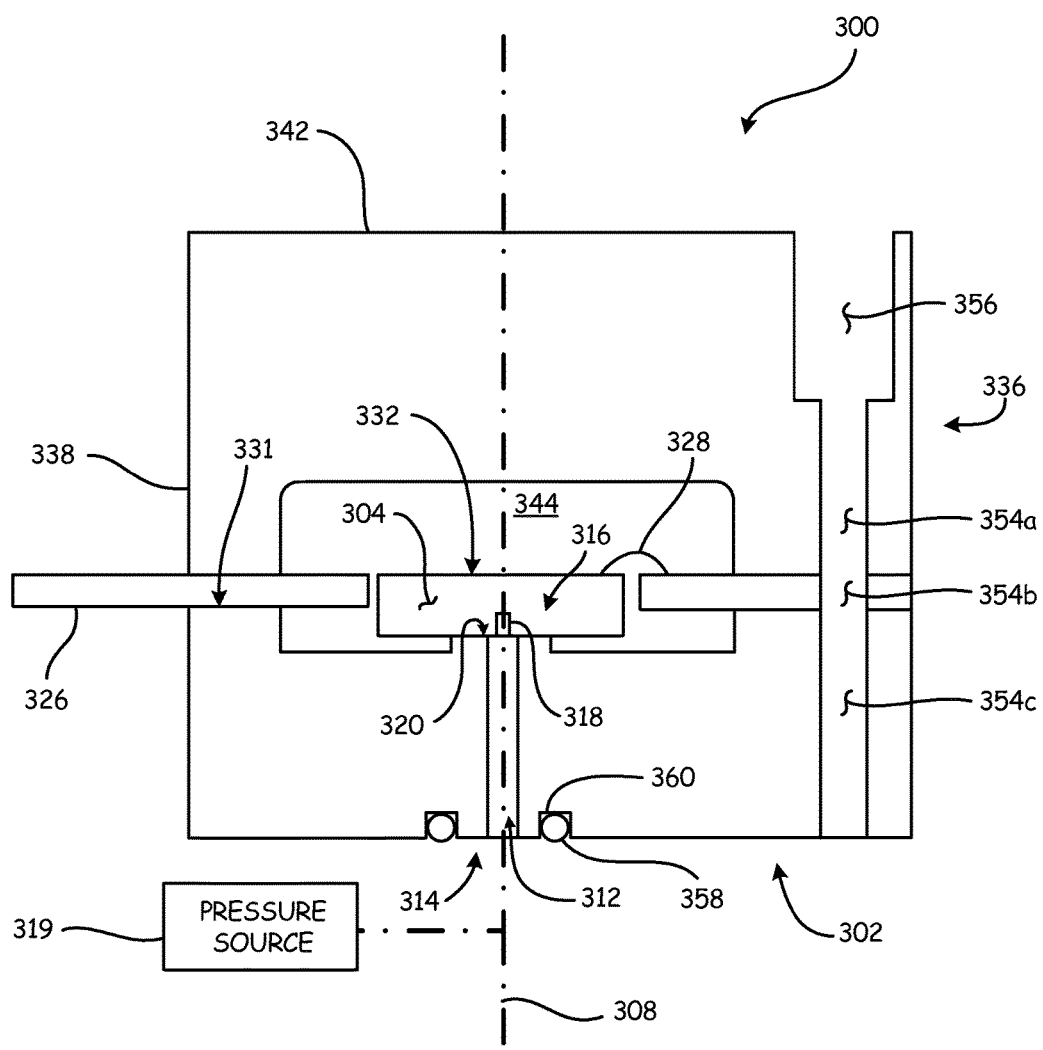
FIG. 4 is a cross-sectional view of a sensor package having a die bonded to a mounting surface and a structural cap.

FIG. 4 is a cross-sectional view of sensor package 300 that includes manifold 302 for supporting die 304, manifold 302 and cap 336 being configured to retain forces imposed on sensor package 300 from pressure source 319. Except for the differences described hereafter, like reference numbers correspond to components of sensor package 300 that are similar in form and function to previously described components.

Sensor package 300 has structural cap 336. Cap 336 includes lip 338 and end wall 342. Lip 338 extends from end wall 342 towards circuit board 326 to form a seal therebetween. Cap 336, circuit board 326 and manifold 302 also include clearance holes 354a, 354b, and 354c, respectively, for receiving a fastener (not shown). The fastener (not shown) is recessed within counter bore 356 of cap 336 to secure sensor package 300 to structure (not shown) of pressure source 319. Lip 338 and end wall 342 are configured to retain forces due to pressure source 319 in the event pressure escapes passage 312 into internal cavity 344. Cavity 344 can become pressurized following a structural failure of die 304 or leakage along mounting surface 320. For example, cap 336 can be used to retain pressures from 3500 kPa (507.6 psi) to 7750 kPa (1124.0 psi). Thus, cap 336 provides a failsafe feature of sensor package 300, allowing containment of pressure source 319 in the event of a failure.

Manifold 302 also includes seal 358 that is received within groove 360. Groove 360 is axisymmetric about central axis 308. Seal 358 prevents leakage of pressure source 319 between manifold 302 and the structure of pressure source 319 to which sensor package 300 is secured.

The fastener (not shown) received within clearance holes 354a-c, secures sensor package 300 against a force due to the pressure of source 319 at seal 358. Although only one clearance hole is shown in FIG. 4, multiple fasteners can be spaced circumferentially about central axis 308 to secure sensor package 300. For example, sensor package 300 can include three clearance holes and fasteners (not shown) that are equally spaced about central axis 308.

Discussion of Possible Embodiments

The following are non-exclusive descriptions of possible embodiments of the present invention.

A sensor package includes a manifold and a MEMS die. The manifold includes a cylindrical body, a flange, and a mounting surface. The cylindrical body defines a first passage that extends longitudinally along a central axis from a first exterior end to an interior end of the cylindrical body. The flange extends from an outer periphery of the cylindrical body. The mounting surface is disposed at the interior end of the first passage. A surface area of the mounting surface is less than a surface area of the MEMS die.

The sensor package of the preceding paragraph can optionally include, additionally and/or alternatively, any one or more of the following features, configurations and/or additional components:

A further embodiment of the foregoing sensor package, wherein the cylindrical body can further define a recess extending from the flange to the mounting surface such that the MEMS die contacts the manifold solely at the mounting surface.

A further embodiment of any of the foregoing sensor packages, wherein a linear distance along the mounting surface from the first passage to an outer periphery of the mounting surface can be configured to provide a hermetic seal between the manifold and the MEMS die.

A further embodiment of any of the foregoing sensor packages can further include a circuit board supported by the flange and a wire-bonded connection extending from the MEMS die to the circuit board, wherein the connection forms a lop between the MEMS die and the circuit board to accommodate differential displacements therebetween.

A further embodiment of any of the foregoing sensor packages, wherein the die, the circuit board, and the wire-bonded connection can be coated with an environmental barrier.

A further embodiment of any of the foregoing sensor packages can further include a cap having a mating surface conforming to the flange, wherein the circuit board extends between the cap and the flange.

A further embodiment of any of the foregoing sensor packages, wherein the cap can be configured to retain a pressurized medium within the sensor package, and wherein the pressurized medium has a pressure between 3500 kPa and 7700 kPa.

A further embodiment of any of the foregoing sensor packages can further include a fastener extending through a clearance hole defined by the cylindrical body of the manifold for securing the sensor package to a pressure source.

A further embodiment of any of the foregoing sensor packages can further include a first seal disposed within a first groove of the cylindrical body, wherein the first groove is along a portion of the cylindrical body adjacent to the exterior end.

A further embodiment of any of the foregoing sensor packages, wherein the cylindrical body can further define a second passage extending from a second exterior end to the interior end, and wherein the first and second exterior ends can communicate with different pressures sources.

A further embodiment of any of the foregoing sensor packages and further include a second seal disposed within a second groove of the cylindrical body, wherein the cylindrical body can have a minor diameter and a major diameter, and wherein the first groove can be disposed along the minor diameter and the second groove can be disposed along the major diameter such that the second exterior end of the second passage can be disposed between the first and second grooves.

A further embodiment of any of the foregoing sensor packages can further include a plug inserted into the cylindrical body at the first exterior end, wherein the plug seals the first passage, and the cylindrical body can further define a first and second ports, each extending transverse to the central axis, and wherein the cylindrical body can further define a second passage extending substantially parallel to the central axis from the mounting surface to communicate with the second port.

A further embodiment of any of the foregoing sensor packages can further include a first diaphragm that communicates with the first passage and a second diaphragm that communicates with the second passage, wherein the sensor package contains a fluid between the mounting surface and the first and second diaphragm to isolate the MEMS die.

A further embodiment of any of the foregoing sensor packages, wherein the mounting surface can be offset towards the exterior end of the passage relative to the flange.

A further embodiment of any of the foregoing sensor packages, wherein the MEMS die can be substantially aligned with the flange.

A further embodiment of any of the foregoing sensor packages, wherein a portion of the recess adjacent the mounting surface can have a cross-section with respect to the central axis that is substantially triangular.

A further embodiment of any of the foregoing sensor packages, wherein the recess can be axisymmetric about the central axis, and wherein a depth of the cross-section can be equal to or greater than a diameter of the mounting surface.

A manifold for a MEMS sensor package includes a cylindrical body, a flange, and a mounting surface. The cylindrical body defines a passage that extends longitudinally along a central axis from a first exterior end to an interior end of the cylindrical body. The flange extends from the cylindrical body and has an outer periphery that is configured to support a print circuit board. The mounting surface is disposed at the interior end of the passage. The surface area of the mounting surface is less than the surface area of a MEMS die configured to mate with the mounting surface.

The manifold of the preceding paragraph can optionally include, additionally and/or alternatively, any one or more of the following features, configurations and/or additional components:

A further embodiment of the foregoing manifold, wherein a linear distance along the mounting surface from the first passage to an outer periphery of the mounting surface can be configured to provide a hermetic seal between and the MEMS die.

A further embodiment of any of the foregoing manifolds, wherein the cylindrical body can further define a recess extending from the flange to the mounting surface.

A further embodiment of any of the foregoing manifolds, wherein the mounting surface can be offset towards the exterior end of the passage relative to the flange.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A sensor package comprising:
   a manifold comprising:
      a cylindrical body defining a first passage extending longitudinally along a central axis from a first exterior end to an interior end of the cylindrical body;
      a flange extending from the cylindrical body along an outer periphery of the cylindrical body; and
      a mounting surface disposed at the interior end of the first passage; and
   a MEMS die having a mating surface bonded to the mounting surface of the manifold, wherein a surface area of the mounting surface is less than a surface area of the mating surface of the MEMS die.

2. The manifold of claim 1, wherein the cylindrical body further defines a recess extending from the flange to the mounting surface such that the MEMS die contacts the manifold solely at the mounting surface.

3. The manifold of claim 1, wherein a linear distance along the mounting surface from the first passage to an outer periphery of the mounting surface is configured to provide a hermetic seal between the manifold and the MEMS die.

4. The sensor package of claim 1 and further comprising:
   a circuit board supported by the flange, and
   a wire-bonded connection extending from the MEMS die to the circuit board, wherein the connection forms a loop between the MEMS die and the circuit board to accommodate differential displacements therebetween.

5. The sensor package of claim 4, wherein the die, the circuit board, and the wire-bonded connection are coated with a conformable, dielectric and moisture barrier.

6. The sensor package of claim 4 and further comprising:
   a cap having a lip, wherein an outer periphery of the lip conforms to an outer periphery of the flange, wherein the circuit board extends between the lip and the flange.

7. The sensor package of claim 6, wherein the cap is configured to retain a pressurized medium within the sensor package, and wherein the pressurized medium has a pressure between 3500 kPa and 7750 kPa.

8. The sensor package of claim 1 and further comprising:
   a fastener extending through a clearance hole defined by the cylindrical body of the manifold for securing the sensor package to a pressure source.

9. The sensor package of claim 1 and further comprising:
   a first seal disposed within a first groove of the cylindrical body, wherein the first groove is along a portion of the cylindrical body adjacent to the exterior end.

10. The sensor package of claim 1, wherein the cylindrical body further defines a second passage extending from a second exterior end to the interior end, and wherein the first and second exterior ends communicate with different pressure sources.

11. The sensor package of claim 10 and further comprising:
    a second seal disposed within a second groove of the cylindrical body, wherein the cylindrical body has a minor diameter and a major diameter, and wherein the first groove is disposed along the minor diameter and the second groove is disposed along the major diameter such that the second exterior end of the second passage is disposed between the first and second grooves.

12. The sensor package of claim 1 and further comprising:
    a plug inserted into the cylindrical body at the first exterior end, wherein the plug seals the first passage, and wherein the cylindrical body further defines a first and second ports, each extending transverse to the central axis, and wherein the first port communicates with the first passage, and wherein the cylindrical body further defines a second passage extending substantially parallel to the central axis from the mounting surface to communicate with the second port;
    a first diaphragm that communicates with the first passage; and
    a second diaphragm that communicates with the second passage, wherein the sensor package contains a fluid between the mounting surface and the first and second diaphragms to isolate the MEMS die.

13. The sensor package of claim 2, wherein the mounting surface is offset towards the exterior end of the passage relative to the flange.

14. The sensor package of claim 4, wherein the MEMS die is substantially aligned with the circuit board.

15. The sensor package of claim 2, wherein a portion of the recess adjacent the mounting surface has a cross-section with respect to the central axis that is substantially triangular.

16. The sensor package of claim 15, wherein the recess is axisymmetric about the central axis, and wherein a depth of the cross-section is equal to or greater than a diameter of the mounting surface.

17. A manifold for supporting a MEMS die and a circuit board of a MEMS sensor package, the manifold comprising:
    a cylindrical body defining a passage and a recess, wherein the passage extends longitudinally through the cylindrical body along a central axis from an exterior end to an interior end of the cylindrical body;
    a flange extending from an exterior surface of the cylindrical body; and
    a mounting surface disposed at the interior end of the passage, wherein the recess extends between an outer periphery of the flange and the mounting surface, and wherein the recess is axisymmetric with respect to the central axis and has a portion adjacent the mounting surface having a substantially triangular cross-section.

18. The manifold of claim 17, wherein a linear distance along the mounting surface from the passage to an outer periphery of the mounting surface is configured to provide a hermetic seal between the manifold and the MEMS die.

19. The manifold of claim 17, wherein the mounting surface is offset towards the exterior end of the passage relative to the flange.

20. The sensor package of claim 2, wherein an outer periphery of the MEMs die coincides with the recess.

* * * * *